United States Patent
Mueller et al.

(10) Patent No.: US 11,404,471 B2
(45) Date of Patent: Aug. 2, 2022

(54) OPTOELECTRONIC SEMICONDUCTOR COMPONENT, AND METHOD FOR PRODUCING AN OPTOELECTRONIC SEMICONDUCTOR COMPONENT

(71) Applicant: Osram OLED GmbH, Regensburg (DE)

(72) Inventors: Christian Mueller, Deuerling (DE); Dominik Scholz, Bad Abbach (DE); Joachim Hertkorn, Woerth An der Donau (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 17/040,084

(22) PCT Filed: Mar. 22, 2019

(86) PCT No.: PCT/EP2019/057203
§ 371 (c)(1),
(2) Date: Sep. 22, 2020

(87) PCT Pub. No.: WO2019/180192
PCT Pub. Date: Sep. 26, 2019

(65) Prior Publication Data
US 2021/0028223 A1    Jan. 28, 2021

(30) Foreign Application Priority Data

Mar. 23, 2018  (DE) ..................... 10 2018 106 970.7

(51) Int. Cl.
*H01L 27/15*    (2006.01)
*H01L 33/08*    (2010.01)
(Continued)

(52) U.S. Cl.
CPC ............ *H01L 27/153* (2013.01); *H01L 33/08* (2013.01); *H01L 33/22* (2013.01); *H01L 33/44* (2013.01)

(58) Field of Classification Search
CPC ....... H01L 27/153; H01L 33/08; H01L 33/22; H01L 33/44
See application file for complete search history.

(56) References Cited

U.S. PATENT DOCUMENTS 8,569,084 B2 * 10/2013 Lee ......................... H01L 33/20
                                                     438/29
2004/0104351 A1 * 6/2004 Shibayama ....... H01L 31/02363
                                                     250/370.11
(Continued)

FOREIGN PATENT DOCUMENTS

DE    102015108532 A1    12/2016
DE    102015119353 A1    5/2017
(Continued)

OTHER PUBLICATIONS

International Search Report issued for the corresponding international application No. PCT/EP2019/057203, dated Jun. 7, 2019, 4 pages (for informational purpose only).

*Primary Examiner* — Andres Munoz
(74) *Attorney, Agent, or Firm* — Viering, Jentschura & Partner MBB

(57) ABSTRACT

An optoelectronic semiconductor component may have a semiconductor body comprising a first region of an n-type conductivity, a second region of a p-type conductivity, an active region capable of generating electromagnetic radiation, a marker layer, a plurality of emission regions and a plurality of recesses. The active region is disposed between the first region and the second region in a plane parallel to the main extension plane of the semiconductor body. The recesses delimit the emission regions in lateral direction.

(Continued)

Starting from the side of the first region facing away from the active region, the recesses extend transversely to the main plane of the semiconductor body in the direction of the second region and adjoin the marker layer or penetrate the marker layer completely. The recesses are formed only in the first region or the recesses extend into the second region and completely penetrate the active region.

12 Claims, 5 Drawing Sheets

(51) Int. Cl.
*H01L 33/22* (2010.01)
*H01L 33/44* (2010.01)

(56) References Cited

U.S. PATENT DOCUMENTS

| | | |
|---|---|---|
| 2004/0173802 A1 | 9/2004 | Yukimoto |
| 2006/0175621 A1 | 8/2006 | Ohtsuka et al. |
| 2009/0068847 A1* | 3/2009 | Griffin, Jr. ............... H01L 24/85 |
| | | 438/754 |
| 2015/0255692 A1 | 9/2015 | Pfeuffer |
| 2017/0092820 A1 | 3/2017 | Kim et al. |
| 2017/0345951 A1 | 11/2017 | Carey et al. |
| 2018/0166499 A1 | 6/2018 | Pfeuffer et al. |
| 2018/0331251 A1 | 11/2018 | Scholz et al. |

FOREIGN PATENT DOCUMENTS

| | | |
|---|---|---|
| EP | 2816617 A1 | 12/2014 |
| JP | 2000332290 A | 11/2000 |
| WO | 2014033041 A1 | 3/2014 |

* cited by examiner

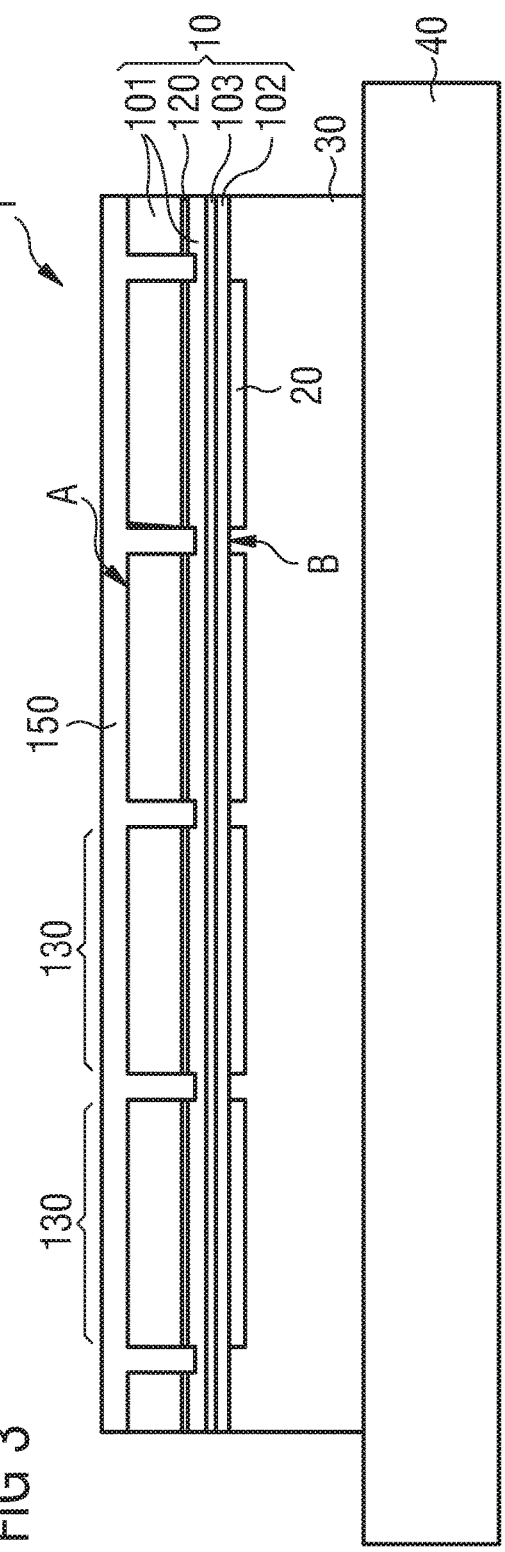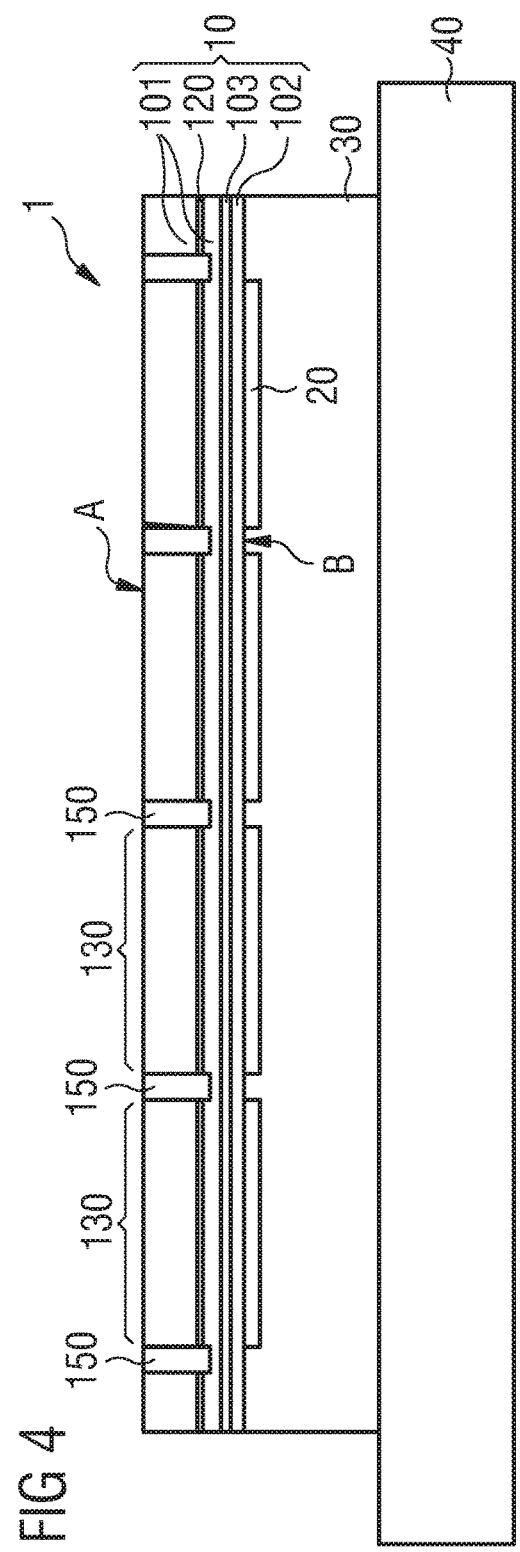

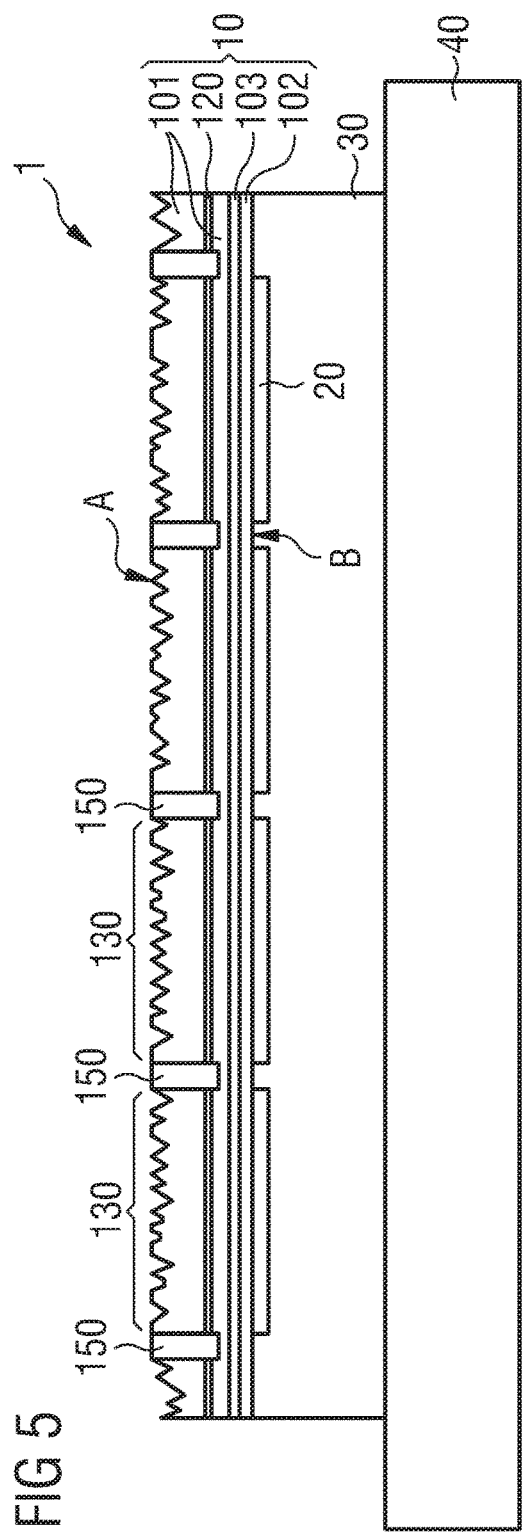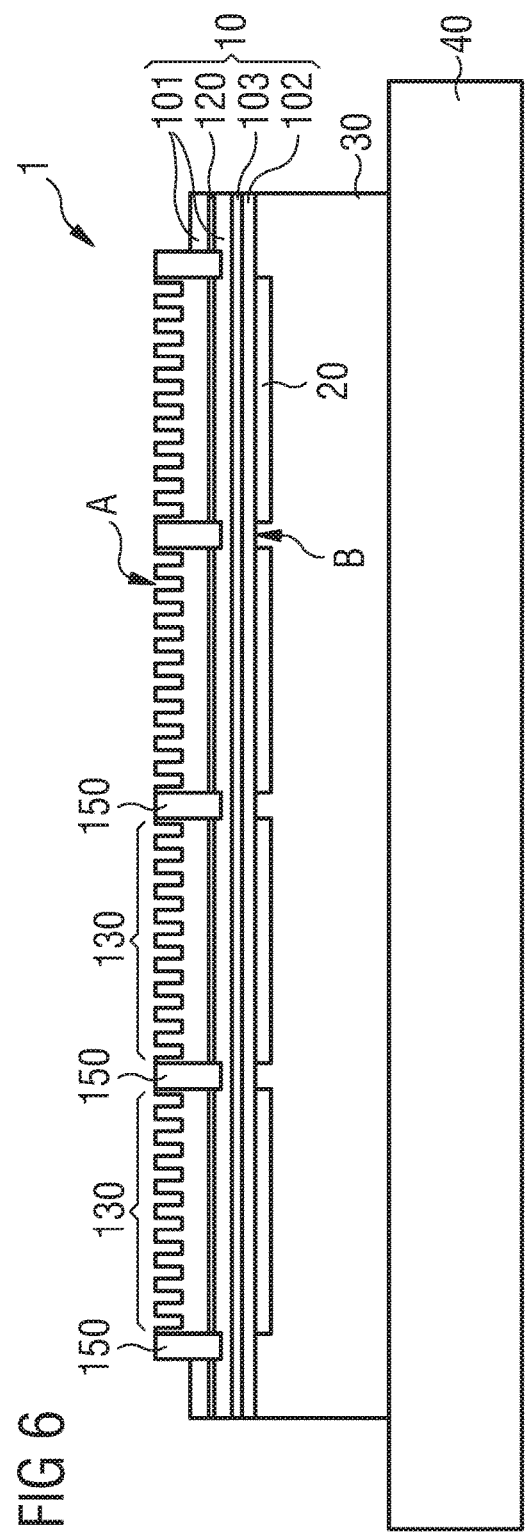

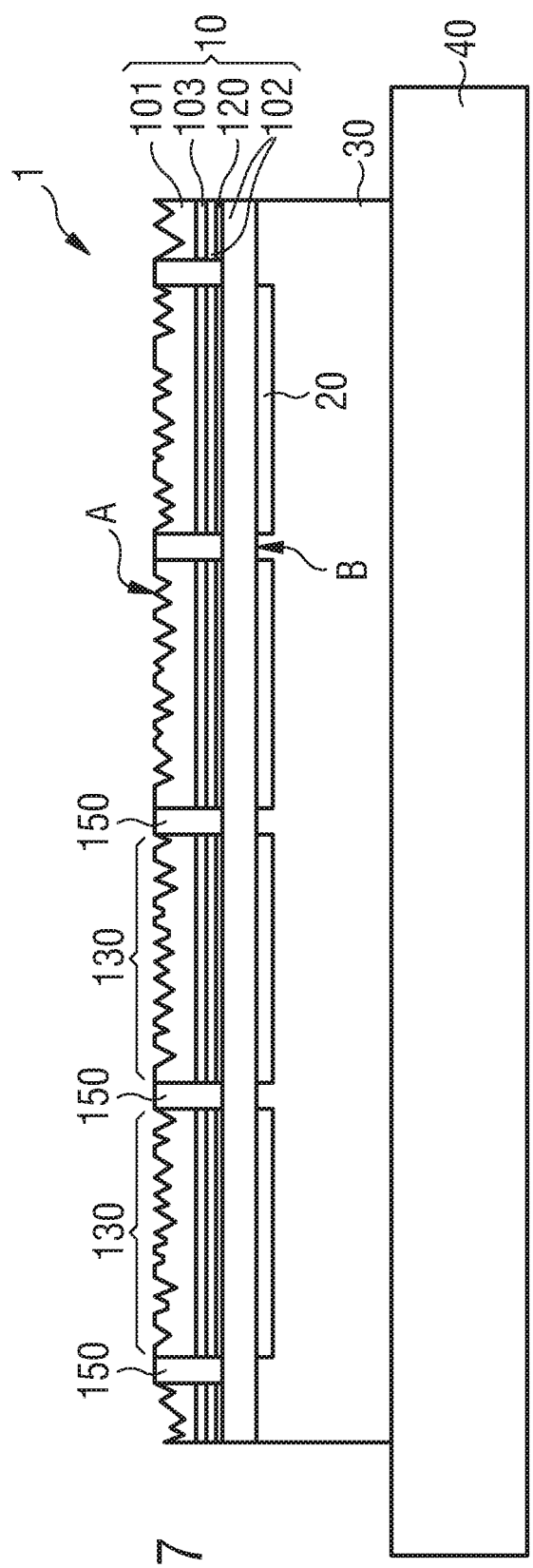

OPTOELECTRONIC SEMICONDUCTOR COMPONENT, AND METHOD FOR PRODUCING AN OPTOELECTRONIC SEMICONDUCTOR COMPONENT

CROSS-REFERENCE TO RELATED APPLICATIONS

The present application is a national stage entry according to 35 U.S.C. § 371 of PCT application No.: PCT/EP2019/057203 filed on Mar. 22, 2019; which claims priority to German Patent Application Serial No.: 10 2018 106 970.7 filed on Mar. 23, 2018; all of which are incorporated herein by reference in their entirety and for all purposes.

TECHNICAL FIELD

An optoelectronic semiconductor component and a method for producing an optoelectronic semiconductor component are specified. In particular, the optoelectronic semiconductor component may be a radiation-emitting optoelectronic semiconductor component which emits electromagnetic radiation, for example light, during operation.

BACKGROUND

One task to be solved is to specify an optoelectronic semiconductor component which has improved optical properties.

Another task to be solved is to specify a method for the production of an optoelectronic semiconductor component which allows a simplified production.

SUMMARY

According to at least one embodiment of the optoelectronic semiconductor component, the optoelectronic semiconductor component comprises a semiconductor body with a first region of an n-type conductivity, a second region of a p-type conductivity and an active region which is suitable for generating electromagnetic radiation.

The active region is arranged between the first region and the second region in a plane parallel to the main extension plane of the semiconductor body and may comprise a pn junction, a double heterostructure, a single quantum well (SQW) or a multi quantum well (MQW) structure for generating radiation. The main extension plane of the semiconductor body is transverse, such as perpendicular to the stacking direction of the semiconductor body. The regions of the semiconductor body may be grown epitaxially.

The formation of a p-type conductivity or an n-type conductivity may be achieved by doping the semiconductor material with a p-type material such as boron, indium, magnesium or aluminum or with an n-type material such as silicon, magnesium, phosphorus, arsenic or antimony.

The semiconductor body may be based on a nitride compound semiconductor. "Based on nitride compound semiconductors" means in the present context that the active epitaxial layer sequence or at least one layer thereof comprises a nitride III/V compound semiconductor material, such as $Al_nGa_mIn_{1-n-m}N$, wherein $0 \leq n \leq 1$, $0 \leq m \leq 1$ und $n+m \leq 1$. This material must not necessarily have a mathematically exact composition according to the above formula. Rather, it may comprise one or more dopants as well as additional components that do not substantially change the characteristic physical properties of the $Al_nGa_mIn_{1-n-m}N$ material. However, for the sake of simplicity, the above formula only includes the essential components of the crystal lattice (Al, Ga, In, N), even if these may be partially replaced by small amounts of other substances.

A semiconductor body based on a nitride compound semiconductor may form a p-type conductivity by doping with magnesium and/or an n-type conductivity by doping with silicon.

Furthermore, the optoelectronic semiconductor component comprises a marker layer, a first main side, a second main side, a plurality of emission regions and a plurality of recesses.

The marker layer is oriented parallel to the main extension plane of the semiconductor body and is arranged in particular within the semiconductor body, for example in the first region. The marker layer is used, in particular in an etching process, to determine the exact etching depth. When the marker layer is reached, the etching behaviour changes and/or a measurable signal is produced, on the basis of which the etching depth can be adjusted to the marker layer.

The emission regions denote separately controllable regions of the active region and are arranged at a lateral distance from each other. The emission regions divide the chip into pixels. Each emission region can be electrically controlled separately.

The recesses delimit the emission regions in lateral direction and extend transversely, such as perpendicular to the direction of extension of the main plane of the semiconductor body. The boundary surfaces of the recesses represent a step in the refractive index for electromagnetic radiation within the semiconductor body and thus reduce crosstalk from adjacent emission regions.

The first main side delimits the semiconductor body on the side of the first region facing away from the active region and is intended for coupling out electromagnetic radiation from the semiconductor body. To improve the output efficiency of the first main side, the first main side is roughened or structured. This structuring can, for example, take the form of small pyramids. Due to the roughening or structuring of the surface of the first main surface, the waveguide effect of the semiconductor body is reduced, thus favourably increasing the output efficiency. The waveguide effect is based on the total reflection of electromagnetic radiation occurring at parallel transparent boundary surfaces.

The second main side delimits the semiconductor body on the side of the second region facing away from the active region and is intended for mounting the optoelectronic semiconductor component on, for example, a further connection carrier.

The recesses adjoin the marker layer or penetrate the marker layer, such as completely. To be able to use the marker layer as a depth limit during an etching process, the depth of the recesses to be created must at least reach the marker layer or penetrate the marker layer. The marker layer contains a material or a material composition that is different from the material surrounding the marker layer.

The recesses are only formed in the first region or extend into the second region and completely penetrate the active region. In other words, the recesses may completely penetrate the active region and extend over the first and second regions or may be formed only within the first region and leave the active region untouched. Full penetration of the active region provides advantageous optical isolation of the emission regions from each other. On the other hand, if penetration of the active region is avoided, there are advantageously fewer defect locations within the active region where undesirable non-radiative recombination can occur.

According to at least one embodiment of the optoelectronic semiconductor component, the optoelectronic semiconductor component comprises a semiconductor body comprising a first region of an n-type conductivity, a second region of a p-type conductivity, an active region suitable for generating electromagnetic radiation, a marker layer, a first main side, a second main side, a plurality of emission regions and a plurality of recesses, wherein the active region between the first region and the second region is arranged in a plane parallel to the main extension plane of the semiconductor body, the emission regions are separately controllable regions of the active region and are arranged laterally spaced apart from each other, the recesses delimit the emission regions in a lateral direction, the first main side delimits the semiconductor body on the side of the first region remote from the active region and is intended for coupling out electromagnetic radiation from the semiconductor body, the first main side is roughened or structured, the second main side delimits the semiconductor body on the side of the second region facing away from the active region, the marker layer is oriented parallel to the main plane of the semiconductor body, the recesses, starting from the first main side, extend transverse to the main extension plane of the semiconductor body in the direction of the second main side and adjoin the marker layer or may penetrate the marker layer completely, and wherein the recesses are only formed in the first region or the recesses extend into the second region and completely penetrate the active region.

An optoelectronic semiconductor component described here is based on the following considerations, among others. To produce a pixelated optoelectronic semiconductor component, i.e. a semiconductor component with a plurality of emission regions, it is necessary to make the individual emission regions separately controllable. Therefore it is necessary to electrically isolate the emission regions from each other. The electrically separated control ensures that individual emission regions can be illuminated without influencing the adjacent emission region. However, in the optical region of the optoelectronic semiconductor component, crosstalk also occurs between adjacent emission regions due to waveguide effects and light scattering. The crosstalk of the emission regions causes a deterioration of the contrast.

The optoelectronic semiconductor component described here makes use, among other things, of the idea of using not only electrical insulation of the emission regions from each other but also optical insulation of the individual emission regions in order to obtain an optoelectronic semiconductor component with improved contrast. This is done, for example, by introducing recesses and further by filling these recesses with optional reflective material.

According to at least one embodiment of the optoelectronic semiconductor component, an optical isolator is arranged in the recesses, which is formed with a metal and/or a dielectric and optionally has a high reflectivity for a central wavelength of an electromagnetic radiation generated by the optoelectronic semiconductor component and in particular emitted by the active region. The optical isolator serves to optically isolate adjacent emission regions from one another and prevents crosstalk from one emission region into one of the adjacent emission regions. A high reflectivity of the optical isolator prevents the undesired absorption of electromagnetic radiation and thus an undesired loss of electromagnetic radiation. The transparency of the filling material of the optical isolator can be variably defined, which allows the crosstalk of the emission regions to be specifically adjusted to a desired value.

According to at least one embodiment of the optoelectronic semiconductor component, the optical isolator is formed or consists of one of the following materials: copper, nickel, gold, silver or aluminum. These materials are characterized above all by a high reflectivity for electromagnetic radiation.

According to at least one embodiment of the optoelectronic semiconductor component, the optical isolator is formed or consists of one of the following materials: silicon oxide, titanium oxide, tantalum oxide, silicon nitride, silicon oxynitride or niobium oxide.

According to at least one embodiment of the optoelectronic semiconductor component, the optical isolator is designed as a dielectric mirror. A dielectric mirror is a sequence of dielectric layers with defined optical thickness and different refractive indices. Due to the refractive index steps at the boundary surfaces of the different materials, the layer stack acts as a reflective layer for a wavelength for which the selected optical layer thicknesses result in constructive interference. The optical isolator can therefore also consist of several successive layers whose main direction of extension is transverse, such as perpendicular to the main plane of extension of the semiconductor body.

According to at least one embodiment of the optoelectronic semiconductor component, the marker layer contains aluminum, indium and/or nitrogen. In a non-limiting embodiment, the marker layer is based on aluminum indium gallium nitride. Such marker layers show an advantageously strong signal for example during etching in a plasma etching process. This makes it possible to determine exactly when the marker layer has been reached during an etching process, which, if the arrangement of the marker layer within the semiconductor body is known, allows to infer the etching depth reached.

According to at least one embodiment of the optoelectronic semiconductor component, a plurality of mirror layers is arranged on the second main side between each of the recesses, which are aligned parallel to the main plane of extension of the semiconductor body. These mirror layers are formed, for example, with silver and have a high reflectivity for a central wavelength of an electromagnetic radiation emitted by the active region. This prevents electromagnetic radiation from being emitted in the direction of the second main side and advantageously increases the efficiency of the component. Viewed from a direction perpendicular to the main plane of the semiconductor body, the mirror layers are each oriented towards an emission region. In other words, the mirror layers are arranged in such a way that there is a gap between two adjacent emission regions. This arrangement advantageously reduces crosstalk from adjacent emission regions.

According to at least one embodiment of the optoelectronic semiconductor component, the semiconductor body is arranged with its second main side on a functional region comprising a plurality of circuit elements and/or contact structures. The functional region performs the contacting and can also have circuit elements which are provided for pixel-precise control of the emission regions. This allows an electrically separate control of each emission region. In addition, mirror layers, for example, can be embedded in the functional region.

According to at least one embodiment of a method for producing an optoelectronic semiconductor component, a semiconductor body is first provided in a step A), comprising a first region of an n-conductivity type, a first main side, an active region which is suitable for generating electromagnetic radiation, a second region of a p-conductivity type, a second main side and a marker layer, wherein the active region is arranged between the first region and the second region and wherein the first main side extends on the side of the first region facing away from the active region and is provided for coupling out electromagnetic radiation. The marker layer is introduced into the semiconductor body, for example during epitaxy or subsequently by means of implantation or diffusion.

Then follows in a step B) the insertion of a plurality of recesses starting from the first main side in the direction of the second main side to divide the active region into laterally spaced emission regions. This is done by means of a first etching process and an etching depth that is so large that the recesses are adjacent to the marker layer or completely penetrate the marker layer. The first etching process may include a dry chemical etching process such as plasma etching, ion beam etching or electron beam etching.

Further, in step C), the first main side is roughened by a second etching process. This second etching process can be wet-chemical, chemical-mechanical or dry-chemical. The roughening reduces the waveguide effect within the semiconductor body and thus advantageously increases the output efficiency of the first main side.

In variations of this embodiment, the order of the steps can also be reversed. In particular, roughening according to step C) can be carried out before the recesses according to step B) are inserted.

According to at least one embodiment of a method for producing an optoelectronic semiconductor component, an optical isolator comprising a metal and/or a dielectric is introduced into the recesses between step B) and step C). The metal can be introduced, for example, by sputtering. A dielectric can be introduced by a CVD process or a PECVD process. In a non-limiting embodiment, the material of the optical isolator is chosen so that the second etching process shows a lower or equal ablation rate for the material of the optical isolator than for the material of the semiconductor body on the first main side. In other words, the optical isolator material optionally shows a lower ablation rate for the second etch process in step C) than the material of the first region of the semiconductor body.

According to at least one embodiment of a method for producing an optoelectronic semiconductor component, the dielectric is deposited by means of an ALD process. ALD (atomic layer deposition) layers can be produced by an ALD deposition process in which a monolayer of atoms is deposited. The deposition of the monolayer can be achieved by depositing several submonolayers, for example by means of an organometallic precursor such as trimethylaluminum. In this process, the methyl groups prevent a complete monolayer by means of "steric hindrance" of the individual ligands and thus initially form a submonolayer. This cycle can be repeated several times until a monolayer is formed from several submonolayers. Thus, no atomic layers are stacked on top of each other, but only a monatomic layer is deposited on a surface. The advantage of such a monolayer in deposition is a very good coverage of the surface and the overforming of even the smallest particles and unevenness. This results in a very dense layer, which can advantageously represent a good diffusion barrier. The formation of the dielectric as an ALD layer is particularly advantageous if the etching depth of the recess is greater than the active region and the active region has thus been damaged. The ALD layer acts as a moisture barrier, protecting the active region from external environmental influences.

According to at least one embodiment of a method for producing an optoelectronic semiconductor component, after the optical isolator has been inserted and before step C), excess material of the optical isolator is removed from the first main side in such a way that the material of the optical isolator is completely preserved within the recesses. Excess material can be removed by means of a chemical mechanical polishing (CMP) process. It is important that the ablation rate of the semiconductor material is greater than or equal to the ablation rate of the optical isolator filler material.

BRIEF DESCRIPTION OF THE DRAWINGS

Further advantages and advantageous designs and further developments of the optoelectronic semiconductor component result from the following non-limiting embodiments, which are related to those shown in the figures.

FIGS. 1 to 5 depict schematic cross-sections through an optoelectronic semiconductor component according to a first non-limiting embodiment at different stages of its production, FIG. 6 depicts a schematic cross-section of an optoelectronic semiconductor component according to a second non-limiting embodiment, FIG. 7 depicts a schematic cross-section of an optoelectronic semiconductor component according to a third non-limiting embodiment.

Identical, similar or similar acting elements are marked with the same reference signs in the figures. The figures and the proportions of the elements shown in the figures to each other are not to be regarded as true to scale. Rather, individual elements may be oversized for better representability and/or comprehensibility.

DETAILED DESCRIPTION

Figure 1:
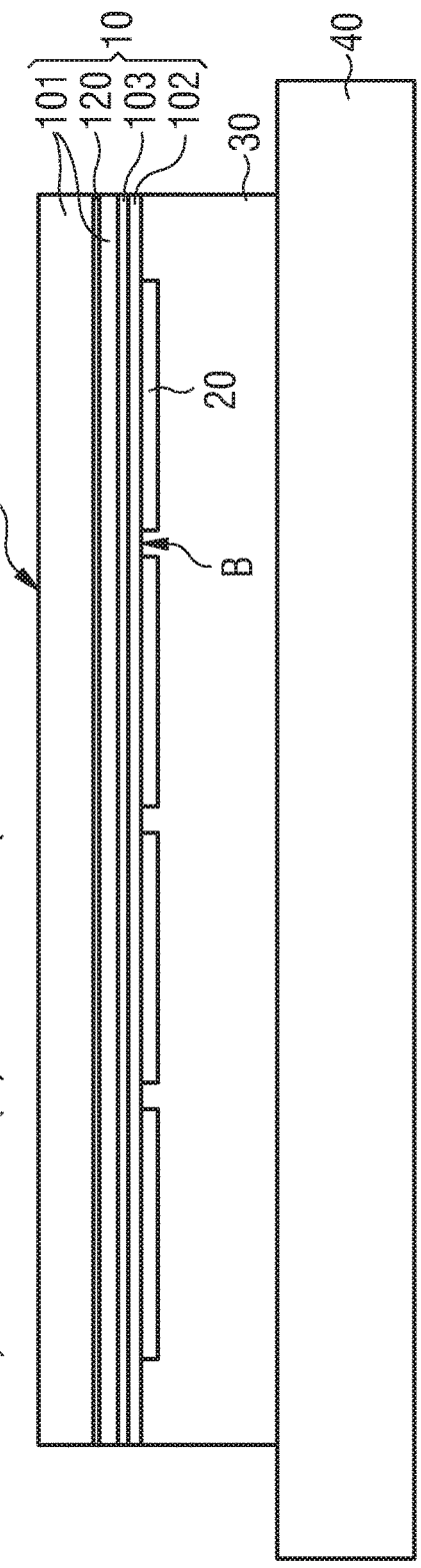

FIG. 1 shows an optoelectronic semiconductor component 1 according to the first non-limiting embodiment in a first step of a method for its production. The optoelectronic semiconductor component 1 comprises a semiconductor body 10 with a first region 101, a second region 102, an active region 103 and a marker layer 120. The semiconductor body 10 is delimited on the side of the first region 101 remote from the active region 103 by a first main side A and on the side of the second region 102 remote from the active region 103 by a second main side B.

The optoelectronic semiconductor component 1 is divided into several emission regions 130. The semiconductor body 10 is arranged on a functional region 30. Within the functional region 30 there are both contact elements and circuit elements which are intended for contacting and/or also for pixel-precise control of the respective emission region 130 of the active layer 103. The functional region 30 allows the electrically separate control of each emission region 130.

Between the semiconductor body 10 and the functional region 30 there is a plurality of mirror layers 20, which are formed in particular with silver or which are designed as dielectric mirrors. The mirror layers 20 have a high reflectivity for electromagnetic radiation. The functional region 30 is mounted on a carrier 40. The carrier 40 can, for example, comprise a semiconductor material and serve to mechanically stabilize the optoelectronic semiconductor component 1.

Figure 2:
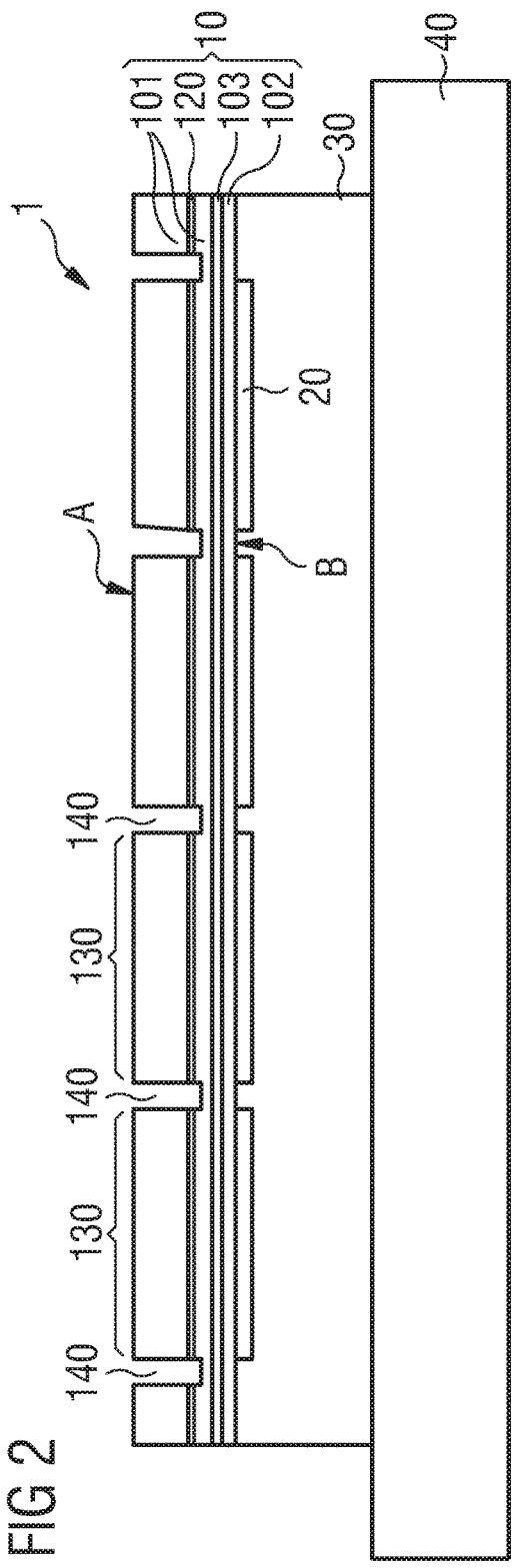

FIG. 2 shows a further step in a method for producing an optoelectronic semiconductor component 1 according to the first non-limiting embodiment. A plurality of recesses 140 is introduced in the first region 101 in the semiconductor body 10. The recesses 140 extend from the first main side A towards the second main side B and completely penetrate the marker layer 120. However, the active region 103 remains unaffected by the recesses 140. The recesses 140 are introduced, for example, by means of a dry chemical etching process, whereby the marker layer 120 allows improved control of the etching depth. The recesses 140 delimit the emission regions 130 in lateral direction and divide the semiconductor body 10 into a plurality of optically separated pixels. The refractive index step at the interface between the material of the first region 101 and the recess 130 advantageously reduces the waveguide effect within the semiconductor body and thus also the crosstalk of adjacent emission regions 130.

FIG. 3 shows a further step in a method for producing an optoelectronic semiconductor component 1 according to the first non-limiting embodiment. The recesses 140 are filled with the material of an optical isolator 150 and the material of the optical isolator 150 covers the first main side A of the semiconductor body 10. This can be either a metal or a dielectric capable of reflecting well the electromagnetic radiation emitted in the active region 103. Similarly, a layer of dielectric may be introduced first and then a layer of metal or vice versa. In particular, the metal may include copper, nickel, gold, aluminum or silver or an alloy of these metals. The dielectric may be formed with silicon oxide, titanium oxide, tantalum oxide, silicon nitride, niobium oxide or silicon oxynitride. The task of the optical isolators 150 is to further reduce or prevent crosstalk of adjacent emission regions 130, caused by waveguide effects or scattering processes within the semiconductor body 10. In this way, the emission regions 130 are advantageously optically separated from each other even more strongly.

In a non-limiting embodiment, a passivation layer is first formed in the recesses 140, which lines the recesses 140. This passivation layer can be formed from an oxide, such as a silicon oxide. Subsequently, a metal, for example copper, nickel, gold, aluminum or silver or an alloy of these metals is introduced into the recesses 140 to form the optical isolators 150. The passivation layer advantageously separates the metallic optical isolators 150 from the semiconductor body.

FIG. 4 shows a further step of a method for producing an optoelectronic semiconductor component 1 according to the first non-limiting embodiment. The material of the optical isolator 150 is removed from the first main side A by a CMP process in such a way that the material of the optical isolators 150 is retained in the recesses 140. By removing the material of the optical isolator 150 from the surface of the first main side A, the reflectivity of the first main side A intended for coupling out electromagnetic radiation generated in the active region 103 is advantageously reduced.

FIG. 5 shows a further step of a method for producing an optoelectronic semiconductor component 1 according to the first non-limiting embodiment. In order to further improve the coupling out probability on the first main side A, the first main side A is roughened by means of a wet chemical process. A roughening reduces the waveguide effect and thus increases the coupling out probability of electromagnetic radiation generated in the active region 103. When roughening the first main side A, it is particularly advantageous to use a process which does not attack the material of the optical isolators 150 or does not attack it significantly. This results in roughening in the material of the first region 101 in the region of the emission regions 130.

FIG. 6 shows a schematic cross-section through an optoelectronic semiconductor component 1 according to a second non-limiting embodiment. The second non-limiting embodiment corresponds essentially to the first non-limiting embodiment shown in FIG. 5, but differs in the type of roughening of the first main surface A. The first main side A is patterned by a dry chemical etching process to reduce the waveguide effect within the semiconductor body 10. For example, the structuring includes regular structuring in the form of pyramids or truncated cones.

FIG. 7 shows a schematic cross-section of an optoelectronic semiconductor component 1 according to a third non-limiting embodiment. The third non-limiting embodiment is essentially similar to the first non-limiting embodiment shown in FIG. 4. However, the position of the marker layer 120 and the position of the active region 103 are different. In the third non-limiting embodiment of the optoelectronic semiconductor component 1, the recesses 140 extend from the first main side A through the first region 101 to the second region 102. The recesses 140 completely penetrate both the active region 103 and the marker layer 120. This results in an even better optical separation of the emission regions 130 from each other. Due to the penetration of the active region 103 through the recessses 140, regions are formed at the interfaces of the active region 103 and the recesses 140, which are more susceptible to harmful environmental influences. To avoid environmental influences on the active region 103, it is advantageous to first fill the recesses 140 with a dielectric applied by means of an ALD process. The density of such an ALD layer prevents moisture and other environmental influences from penetrating into the active region 103. The recesses 140 are then filled with a metal that has a high reflectivity for electromagnetic radiation generated in the active region 103.

Figure 8:
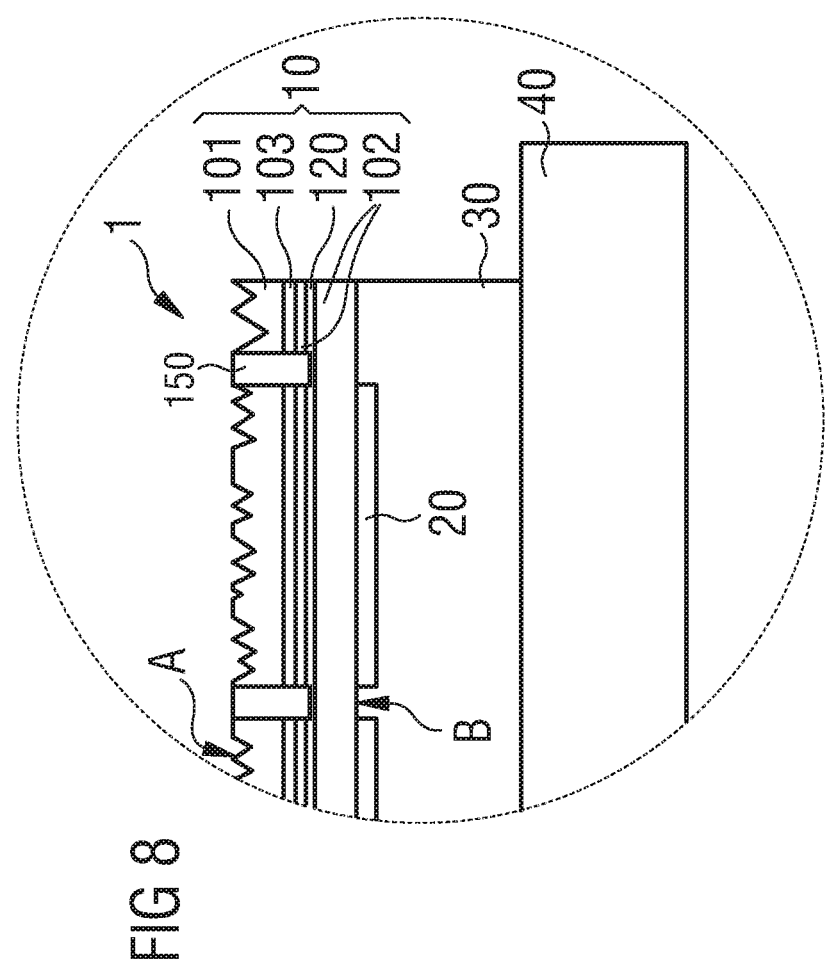
FIG. 8 depicts an enlarged detail of a schematic cross-section of an optoelectronic semiconductor component according to a fourth non-limiting embodiment.

FIG. 8 shows an enlarged detail of a schematic cross-section of an optoelectronic semiconductor component 1 according to a fourth non-limiting embodiment. The fourth non-limiting embodiment is essentially similar to the third non-limiting embodiment shown in FIG. 7. However, the recesses 140, in which the optical isolator 150 is arranged, adjoin the marker layer 120. The recesses 140 do not penetrate the marker layer 120.

The invention is not limited by the description based on the non-limiting embodiments. Rather, the invention comprises each new feature as well as each combination of features, which in particular includes each combination of features in the claims, even if this feature or feature combination is not itself explicitly stated in the claims or non-limiting embodiments.

LIST OF REFERENCE SIGNS

1 optoelectronic semiconductor component
10 semiconductor body
101 first region
102 second region
103 active region
A first main side B second main side
120 marker layer
130 emission region
140 recess
150 optical isolator
20 mirror layer
30 functional region
40 carrier

The invention claimed is:

1. An optoelectronic semiconductor component comprising:
   a semiconductor body comprising a first region having an n-type conductivity, a second region having a p-type conductivity, an active region suitable for generating electromagnetic radiation, and a marker layer;
   a first main side, a second main side, a plurality of emission regions, and a plurality of recesses; wherein:
   the active region is disposed between the first region and the second region in a plane parallel to a main extension plane of the semiconductor body;
   the plurality of emission regions are separately controllable regions of the active region and are arranged laterally spaced apart from one another;
   the plurality of recesses delimit the plurality of emission regions in a lateral direction;
   the first main side delimits the semiconductor body on a side of the first region remote from the active region and is provided for coupling out electromagnetic radiation from the semiconductor body;
   the first main side is roughened or structured;
   the second main side delimits the semiconductor body on a side of the second region remote from the active region;
   the marker layer is arranged within the first region and oriented parallel to the main plane of extension of the semiconductor body;
   the plurality of recesses, starting from the first main side, extend transversely to the main extension plane of the semiconductor body in a direction of the second main side and adjoin the marker layer or penetrate the marker layer; and
   wherein:
   the plurality of recesses are formed only in the first region of the semiconductor body.

2. The optoelectronic semiconductor component according to claim 1, wherein
   an optical isolator is arranged in the plurality of recesses, wherein the optical isolator comprises a metal and/or a dielectric.

3. The optoelectronic semiconductor component according to claim 2, wherein
   the optical isolator comprises or consists of one or more of the following materials: Cu, Ni, Au, Ag, Al.

4. The optoelectronic semiconductor component according to claim 2, wherein
   the optical isolator comprises or consists of one or more of the following materials: silicon oxide, titanium oxide, tantalum oxide, silicon nitride, silicon oxynitride, niobium oxide, or combinations thereof.

5. The optoelectronic semiconductor component according to claim 2, wherein
   the optical isolator is configured as a dielectric mirror.

6. The optoelectronic semiconductor component according to claim 1, wherein
   the marker layer contains nitrogen, aluminum, indium, or combinations thereof.

7. The optoelectronic semiconductor component according to claim 1, wherein
   on the second main side between the plurality of recesses in each case, a plurality of mirror layers is arranged, which are oriented parallel to the main extension plane of the semiconductor body.

8. The optoelectronic semiconductor component according to claim 1, wherein
   the semiconductor body is arranged with its second main side on a functional region comprising a plurality of circuit elements and/or contact structures.

9. A method for producing an optoelectronic semiconductor component, wherein the method comprises:
   providing a semiconductor body comprising a first region of an n-conductivity type, a first main side, an active region suitable for generating electromagnetic radiation, a second region of a p-conductivity type, a second main side and a marker layer, wherein:
   the active region is arranged between the first region and the second region;
   the first main side extends on a side of the first region facing away from the active region and is intended for coupling out electromagnetic radiation,
   the second main side extends on a side of the second region remote from the active region; and
   the marker layer extends in a plane parallel to a main extension plane of the semiconductor body;
   introducing a plurality of recesses starting from the first main side in a direction of the second main side to divide the active region into laterally spaced emission regions by a first etching process with an etching depth selected such that the plurality of recesses adjoin or completely penetrate the marker layer,
   roughening the first main side by a second etching process;
   introducing an optical isolator into the plurality of recesses; wherein the optical isolator comprises a metal and/or a dielectric; and
   removing excess material of the optical isolator from the first main side such that the material of the optical isolator is completely retained within the plurality of recesses.

10. The method for producing an optoelectronic semiconductor component according to claim 9, further comprising depositing the dielectric using an atomic layer deposition (ALD) process.

11. An optoelectronic semiconductor component comprising:
    a semiconductor body comprising a first region of an n-type conductivity, a second region of a p-type conductivity, an active region suitable for generating electromagnetic radiation, a marker layer,
    a first main side, a second main side, a plurality of emission regions and a plurality of recesses, wherein
    the active region is disposed between the first region and the second region in a plane parallel to a main extension plane of the semiconductor body,
    the plurality of emission regions are separately controllable regions of the active region and are arranged laterally spaced apart from one another,
    the plurality of recesses delimit the plurality of emission regions in a lateral direction,
    the first main side delimits the semiconductor body on a side of the first region remote from the active region and is provided for coupling out electromagnetic radiation from the semiconductor body, the first main side is roughened or structured, the second main side delimits the semiconductor body on a side of the second region remote from the active region, the marker layer is oriented parallel to the main plane of extension of the semiconductor body, the plurality of recesses, starting from the first main side, extend transversely to the main extension plane of the semiconductor body in a direction of the second main side and adjoin the marker layer or penetrate the marker layer, and wherein:

the plurality of recesses are formed at least in the first region and the marker layer, and wherein an optical isolator is completely retained in the plurality of recesses; wherein the optical isolator comprises a metal.

12. The optoelectronic semiconductor component according to claim 11, wherein the plurality of recesses is completely filled with the optical isolator.

* * * * *